US008720767B2

(12) United States Patent
Byars et al.

(10) Patent No.: US 8,720,767 B2
(45) Date of Patent: May 13, 2014

(54) SEMICONDUCTOR DEVICE SUPPORT FOR BONDING

(75) Inventors: Jonathan Byars, Fountain Valley, CA (US); Theodore J. Copperthite, Irvine, CA (US)

(73) Assignee: Orthodyne Electronics Corporation, Irvine, CA (US)

( * ) Notice: Subject to any disclaimer, the term of this patent is extended or adjusted under 35 U.S.C. 154(b) by 0 days.

(21) Appl. No.: 13/062,613

(22) PCT Filed: Nov. 19, 2009

(86) PCT No.: PCT/US2009/064422
§ 371 (c)(1),
(2), (4) Date: Mar. 7, 2011

(87) PCT Pub. No.: WO2010/057016
PCT Pub. Date: May 20, 2010

(65) Prior Publication Data
US 2011/0212572 A1      Sep. 1, 2011

Related U.S. Application Data

(60) Provisional application No. 61/114,285, filed on Nov. 13, 2008.

(51) Int. Cl.
*B23K 37/00* (2006.01)
*B23K 31/00* (2006.01)

(52) U.S. Cl.
USPC ............................ 228/4.5; 228/180.5; 228/904

(58) Field of Classification Search
USPC ..................... 228/4.5, 180.5, 5.5; 269/43, 45
See application file for complete search history.

(56) References Cited

U.S. PATENT DOCUMENTS

| | | | | |
|---|---|---|---|---|
| 3,494,817 A | * | 2/1970 | Whitecar | 156/567 |
| 3,608,809 A | * | 9/1971 | Cushman | 228/5.5 |
| 4,635,838 A | * | 1/1987 | Urban | 228/5.5 |
| 4,638,937 A | * | 1/1987 | Belanger, Jr. | 228/5.5 |
| 4,848,639 A | * | 7/1989 | Belanger, Jr. | 228/5.5 |
| 6,454,158 B1 | | 9/2002 | Takahashi | |
| 6,602,726 B1 | | 8/2003 | Malolepszy et al. | |
| 6,814,277 B2 | * | 11/2004 | Monson et al. | 228/212 |
| 6,877,650 B2 | * | 4/2005 | Marsh et al. | 228/49.5 |
| 6,880,742 B2 | * | 4/2005 | Voss et al. | 228/5.5 |
| 7,703,657 B2 | * | 4/2010 | Matsumura et al. | 228/5.5 |
| 7,847,378 B2 | * | 12/2010 | Marsh et al. | 257/676 |
| 2005/0263566 A1 | | 12/2005 | Su | |

FOREIGN PATENT DOCUMENTS

JP      2003-224159 A      8/2003

OTHER PUBLICATIONS

International Search Report Dated May 27, 2010, International Application No. PCT/US2009/064422.

* cited by examiner

*Primary Examiner* — Kiley Stoner
*Assistant Examiner* — Carlos Gamino
(74) *Attorney, Agent, or Firm* — Christopher M. Spletzer, Sr.

(57) ABSTRACT

In one embodiment, a support structure comprises a base, a compliant layer, and a protective layer which is used to secure a semiconductor device, such as a lead-frame, to a window clamp during a bonding process. The compliant layer distributes even loading over the surface of the semiconductor device while clamped. In other embodiments, the compliant layer may be segmented into individual portions corresponding with openings in the window clamp. The window clamp may also have a compliant layer and a protective layer and may be used with or without a compliant layer on the support structure. Features on the protective layer may be included to support structures of the semiconductor device.

43 Claims, 7 Drawing Sheets

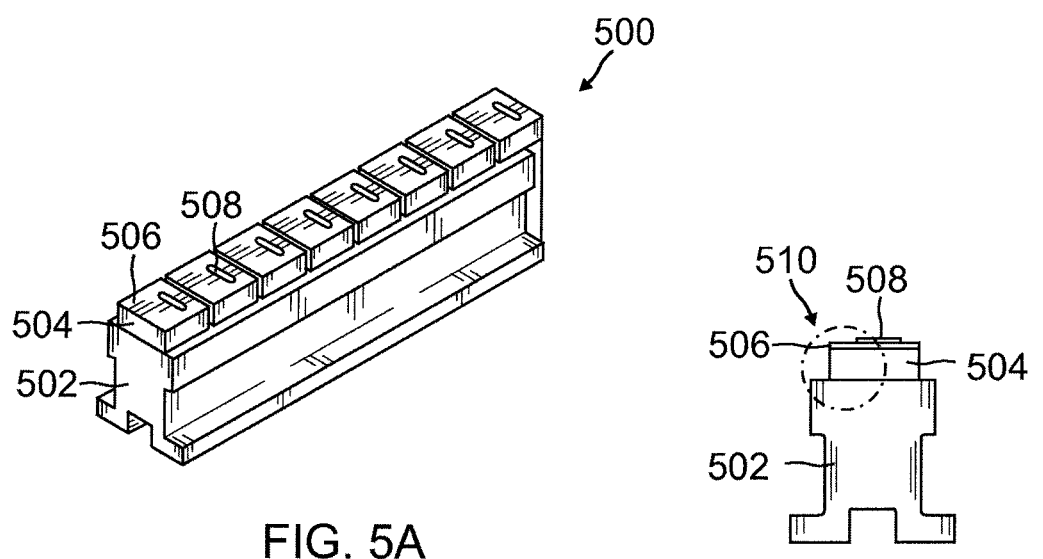
FIG. 5A
FIG. 5B
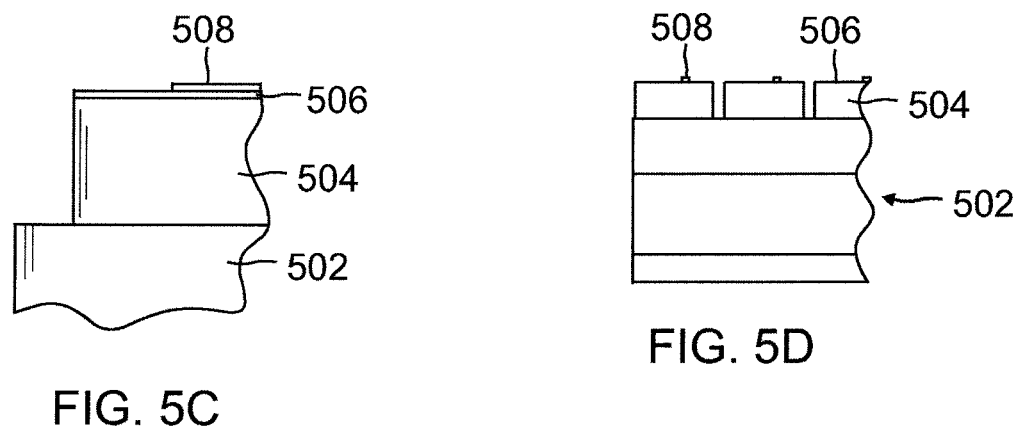
FIG. 5C
FIG. 5D

US 8,720,767 B2

SEMICONDUCTOR DEVICE SUPPORT FOR BONDING

CROSS REFERENCE TO RELATED APPLICATIONS

This application claims the benefit of the International Patent Application No. PCT/US2009/064422 filed on Nov. 19, 2009 which claims the benefit of U.S. Provisional Patent Application No. 61/114,285, filed Nov. 13, 2008, which are incorporated by reference in their entirety.

BACKGROUND

1. Field of the Invention

The present invention generally relates to ultrasonic bonding and more particularly to a support structure used for securing a semiconductor device during the bonding.

2. Related Art

As global markets demand smaller power semiconductor devices for mobile application at lower costs, manufacturers seek to improve the process and make it as efficient as possible. These cost reduction strategies involve using less raw copper material. This forces the creation of highly populated lead-frames used to transport the semiconductor packages through the front-end manufacturing process. Highly populated lead-frames contain many rows and columns of semiconductor devices connected to a matrix by small and thin tie bars. Because of the density of the devices on the lead-frame and their inherently small sizes, properly constraining the packages during the large ultrasonic wire or ribbon bonding process becomes very difficult. Poor clamping leads to an unreliable process and poor quality parts.

FIG. 1 shows one type of conventional clamping that uses an array of thin flexible clamp fingers 102 (only one shown) to constrain specific points on a lead-frame 104 during ultrasonic bonding. Lead-frame 104 is constrained by the spring action of clamp fingers 102. Clamp fingers 102 are designed to flex a specific amount during the clamping operation to ensure even clamping force along lead-frame 104 in the presence of tolerance stack up between components. Due to the flexibility of the clamp fingers, a large amount of tip deflection occurs over the surface of lead-frame 104 (shown by the portion between the two arrows). This movement combined with the high force applied to the clamps can damage the lead-frames by leaving visible marks on the frames. As a result, the placement of the clamps are constrained to areas encapsulated in the final package or areas that are cut away and not included in the final package (for cosmetic reasons). Clamp placement may also be constrained to places on the lead-frame large enough to handle the deflection of the clamp fingers. Furthermore, the use of small and light clamp fingers to secure specific points on the lead-frame can cause unwanted resonance problems during bonding due to the many modes of the clamp fingers in the frequency spectrum close to the bonding frequency. This can cause instability and inconsistency in the bonding process as well as rendering an application impossible to bond with a given set of tooling.

Thus, there is a need for a way to bond lead-frames without the disadvantages of conventional clamping discussed above.

SUMMARY

According to one embodiment, a device for supporting a semiconductor device comprises a base, and a compliant layer over the base, wherein the compliant layer secures the semiconductor device to a window clamp during a bonding process. The device further includes a protective layer over the compliant layer in one embodiment. For example, the semiconductor device may be a lead frame carrying semiconductor dice, and the compliant layer and the protective layer are separated into a plurality of portions over the base in different embodiments.

In another embodiment, a clamping system for securing a semiconductor device comprises a base; a compliant layer over the base; and a window clamp that secures the semiconductor device to the compliant layer during a bonding process. In one embodiment, a protective layer is added over the compliant layer.

A further embodiment is a device for supporting a semiconductor device comprising a window clamp; and a compliant layer over the window clamp, wherein the compliant layer secures the semiconductor device to a support during a bonding process. A protective layer, such as metal, may be added over the compliant layer.

In yet another embodiment, a method for securing a semiconductor device during a bonding process comprises moving a window clamp to a lead frame; moving a supporting device to the lead frame; and compressing a compliant material on the supporting device against the lead frame. The method may further include pressing a protective layer on the supporting device against the lead frame. In one embodiment, moving the window clamp occurs before moving the supporting device and compressing the compliant material.

These and other features and advantages of the present invention will be more readily apparent from the detailed description of the embodiments set forth below taken in conjunction with the accompanying drawings.

BRIEF DESCRIPTION OF THE DRAWINGS

FIGS. 5A-5D show different views of a support according to one embodiment that can be used as the support in FIGS. 2 and 4;

Figure 1:
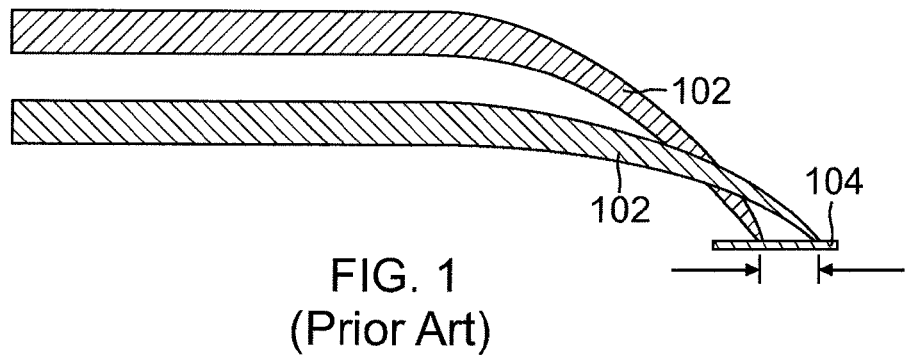
FIG. 1 is a side view of a conventional process of clamping a lead frame with a clamp finger.

Embodiments of the present disclosure and their advantages are best understood by referring to the detailed description that follows. It should be appreciated that like reference numerals are used to identify like elements illustrated in one or more of the figures, wherein showings therein are for purposes of illustrating embodiments of the present disclosure and not for purposes of limiting the same.

DETAILED DESCRIPTION

Figure 2:
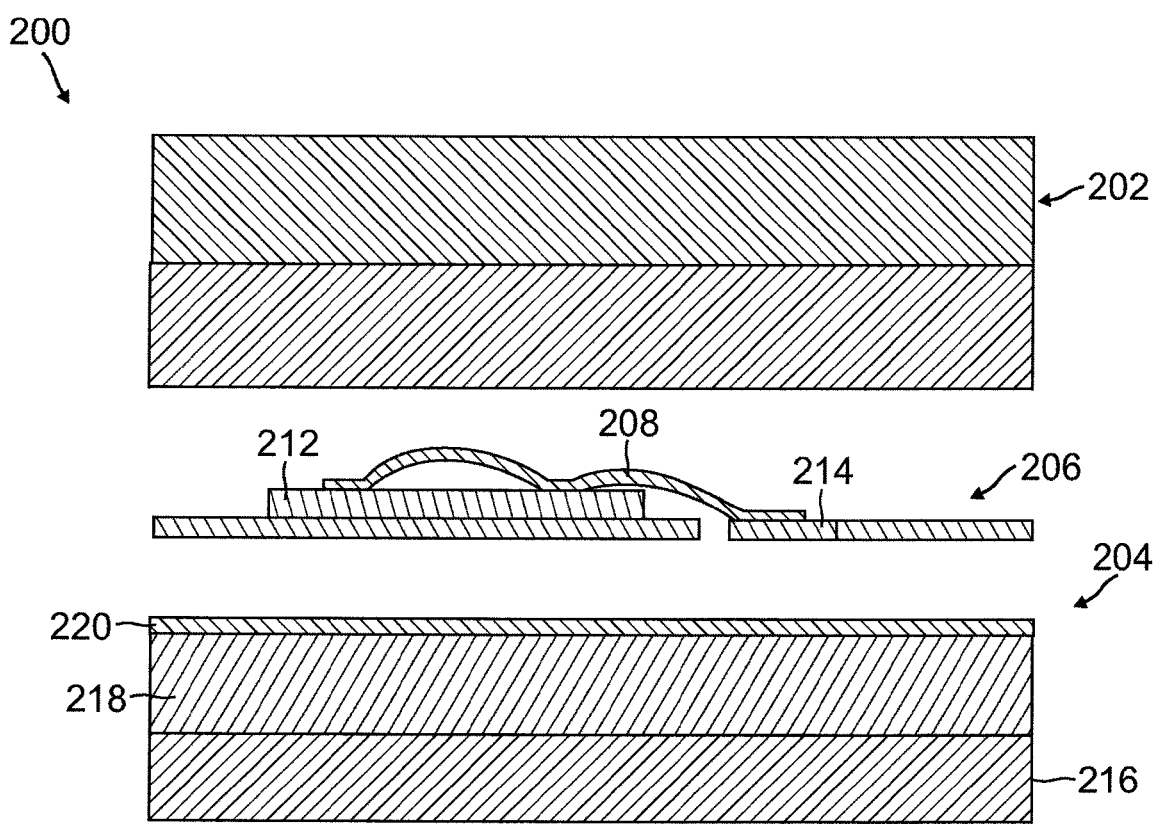
FIG. 2 is a general side view of a clamping system according to one embodiment.

FIG. 2 is a general side view of a clamping system 200 according to one embodiment. Clamping system 200 includes a clamp 202 and a support 204, where clamp 202 and support 204 secure or constrain a semiconductor device 206 during a bonding process, which can be any suitable process, such as ultrasonic bonding of a large wire or a ribbon 208 on a die 212 to conductive a lead 214. In one embodiment, clamp 202 is a window clamp, where wire or ribbon 208 is ultrasonically bonded to 214 on a lead-frame (e.g., a lead-frame portion of semiconductor device 206). Support 204 includes a base 216, a compliant layer 218, and a protective layer 220 in one embodiment. In other embodiments, protective layer 220 may be omitted. Base 216 may be made of a metal, such as aluminum, although other hard base materials may also be suitable.

Compliant layer 218 may be a compliant elastic polymer (elastomer) or polymer composite material with durometers ranging from 2000 to 75 D on the Shore durometer hardness scale. In one embodiment, compliant layer 218 uses polyurethane materials with a hardness falling in the A scale of the Shore hardness test, such as from 20 A to 95 A or from 50 A to 70 A in one embodiment. Such materials provide a relatively even distribution of clamping force. Other materials may also be suitable, dependent upon requirements for a specific application. For example, if an application requires extremely high clamping force, a harder material that can withstand such forces without breaking down may be required.

Compliant layer 218 acts to evenly distribute clamping force around semiconductor device 206 when the material is loaded and compressed against the device and opposing clamp 202 and/or support 204 as clamp 202 bends in response to the stress created by the compression of compliant layer 218. Other compliant materials with similar hardness values can be used in other embodiments. Many visco-elastic material such as elastomers may achieve the same or similar effect. Examples of materials used in other embodiments include rubbers (latex, santoprene, butyl, silicone, SBR, natural rubber, neoprene and hypalon), fabric-reinforced rubbers (to increase stiffness), polymer composites (i.e. brake linings), and plastics (polyethylene, polyesters, acrylic, acetal, fluoropolymers, nylon, and polyimide). Polyurethane may be useful in one embodiment due to is excellent resiliency (ability to withstand many loading-and-unloading cycles). The thickness of compliant layer 218 depends in part on the material used and the application. In one embodiment, the minimum thickness may be approximately 1 mm, and in another embodiment, the minimum thickness range may be between approximately 1 mm and 5 mm.

Protective layer 220, which is a thin metallic shim in one embodiment, can be adhered to the surface of compliant layer 218 to act as a wear surface. Protective layer 220 is thin enough to bend with compliant layer 220 and clamp 202, achieving even clamping pressure over the surface of semiconductor device 206 being clamped. In one embodiment, 300-series stainless steel shim stock between 3 and 15 mils in thickness can be utilized for protective layer 220. Note that protective layer 220 need not be of a uniform thickness and may, in fact, have different thicknesses at different locations of support 204 depending on the structures of semiconductor device 206 (e.g., a lead-frame) requiring support. The material and thicknesses of protective layer may also be dependent upon the desired wear and flexibility requirements. For example, a ceramic protective layer may have excellent wear characteristics but may not provide the desired flexibility and may yield poor results. As clamp 202 bends under the static load caused by the compression of compliant layer 218, a ceramic plate used for protective layer 220, being much stiffer than clamp 202 may not conform to distribute pressure evenly across semiconductor device 206. However, such protective layers could be coated to provide better wear characteristics while maintaining the same flexibility of the base material. An example of a coating achieving such properties is diamond-like carbon (DLC) and titanium nitride (TiN) coatings.

Figure 3:
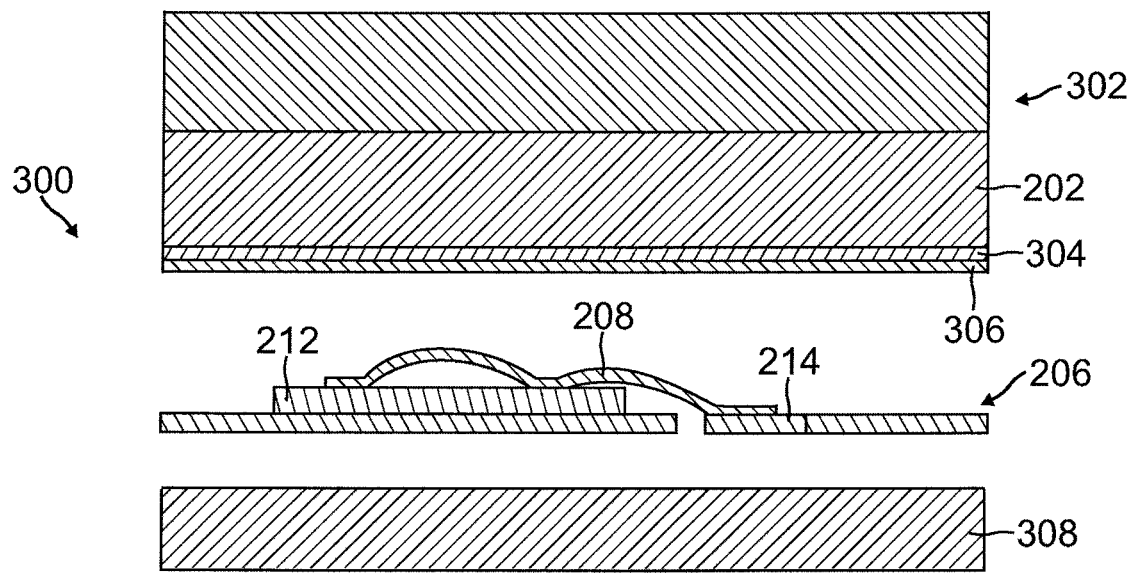
FIG. 3 is a general side view of a clamping system according to another embodiment.

FIG. 3 is a general side view of a clamping system 300 according to another embodiment. Clamping system 300 includes a clamp 302 and a support 308, where clamp 302 and support 308 secure or constrain semiconductor device 206 during a bonding process, which can be any suitable process, such as ultrasonic bonding of large wire or ribbon 208 to die 212 and/or lead 214. Support 308 may be made of a metal, such as aluminum, although other hard base materials may also be suitable.

Clamp 302, which is a window clamp in one embodiment, has rigid clamp or base 202, a compliant layer 304, and a protective layer 306 in one embodiment, although protective layer 306 may be omitted in other embodiments. Compliant layer 304 may have the same or similar properties of compliant layer 218 in FIG. 2. Compliant layer 304, in one embodiment, may require greater dimensional accuracy than compliant layer 218 due to the requirement to conform to very specific areas of semiconductor device 206. To obtain the higher levels of dimensional accuracy in a manufacturing process (die cutting in one embodiment), the thickness of compliant layer 304 is constrained. Generally, the thinner the compliant layer 304 is, the greater the dimensional accuracy. In one embodiment, the minimum thickness of compliant layer 304 may be approximately 0.5 mm, and in another embodiment, between approximately 0.5 mm and 1 mm. Compliant layer 304 acts to evenly distribute clamping force around semiconductor device 206 when the material is loaded and compressed against the device and opposing clamp 302 and/or support 308. Protective layer 306, which is a thin metallic shim in one embodiment, can be adhered to the surface of compliant layer 304 to act as a wear surface. Protective layer 306 is thin enough to bend with compliant layer 304, achieving even clamping pressure over the surface of semiconductor device 206 being clamped. Protective layer 306 may have the same or similar properties as protective layer 220 in FIG. 2.

Figure 4:
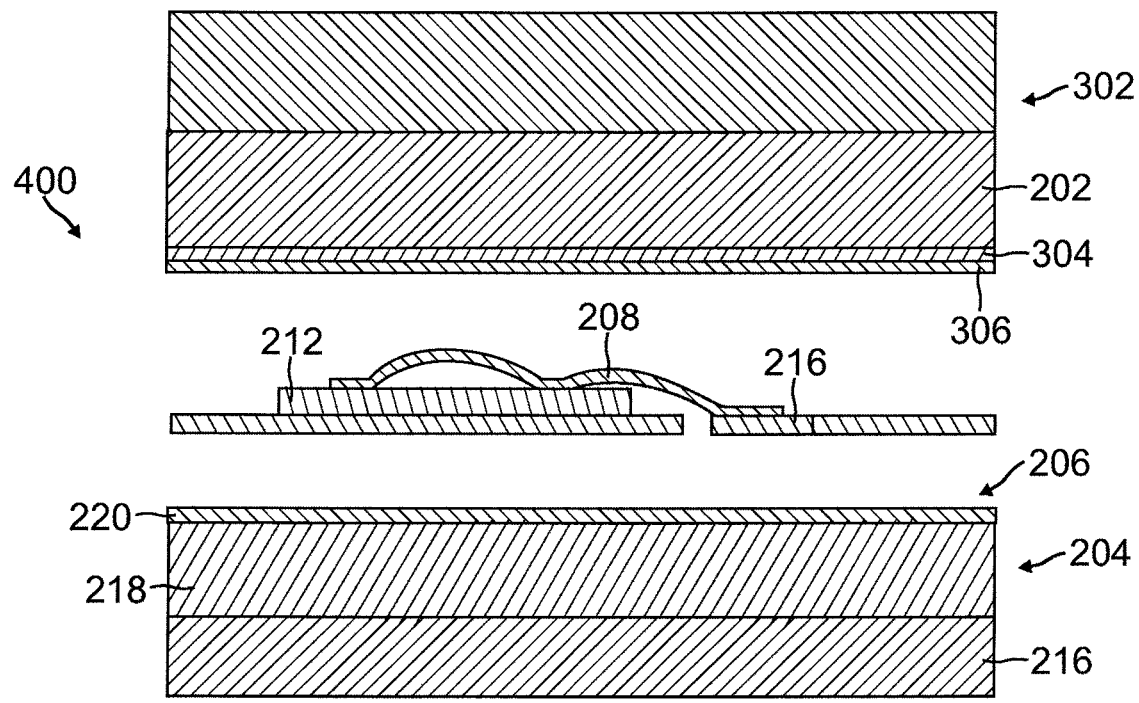
FIG. 4 is a general side view of a clamping system according to a further embodiment.

FIG. 4 is a general side view of another embodiment of a clamping system 400. Clamping system 400 includes support 204 of FIG. 2 and clamp 302 of FIG. 3 to secure or constrain semiconductor device 206 during a bonding process. Thus, in clamping system 400, both clamp 302 and support 204 have a compliant layer and, in some embodiments, a protective layer.

The selection of material, composition and hardness, as well as the basic geometry (i.e. thickness of the compliant portion) and configuration of the compliancy (top, bottom, or both) is highly dependent on the application. For example, a more compliant material may require a greater thickness. The thickness of the compliant layer will determine, at least in part, the stiffness of a material at a given percentage of compression. If low stiffness is needed and the amount of compression of a compliant layer is desired to be large, a thicker layer of material may be used. Low stiffness may be necessary to more evenly distribute load when the alignment between clamp 202 and the surface of compliant layer 218 is not able to be maintained parallel to a certain extent. For example, if a very thin material were used, the amount of misalignment in parallelism may cause one side of the clamping system to not make contact. All the stress will be applied on the side where compliant layer 218 and clamp 202 are closer together.

Figure 6A:
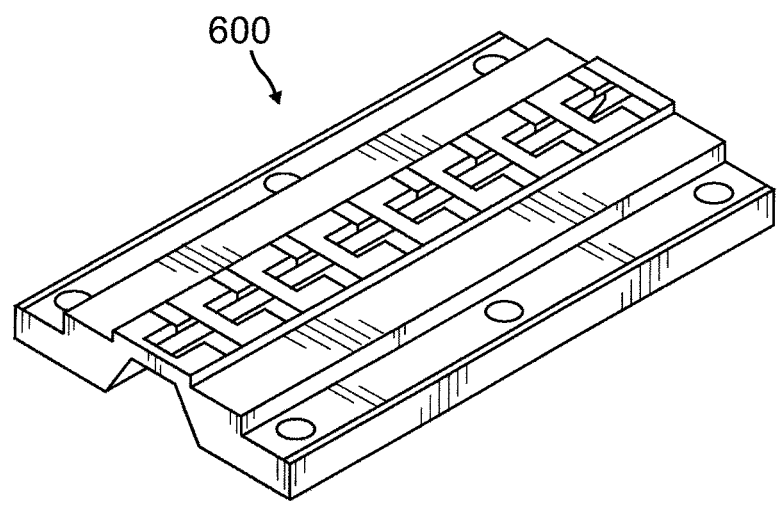
FIGS. 6A and 6B show one embodiment of a window clamp.
Figure 6B:
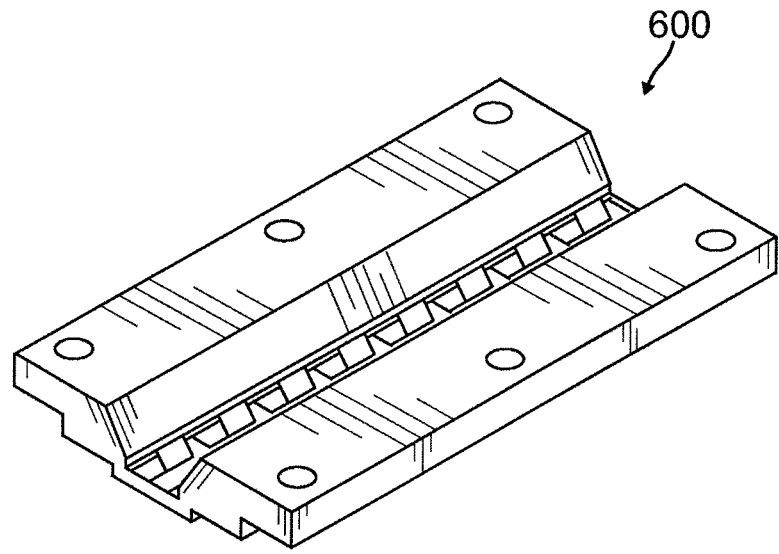

FIGS. 5A-5D show different views of a support 500 according to one embodiment that can be used as support 204 in FIGS. 2 and 4. FIGS. 6A and 6B show top and bottom views, respectively, of a window clamp 600 according to one embodiment that can be used as clamp 202 in FIG. 2. FIG. 5A is a perspective view of support 500 showing a base 502, a compliant layer 504, and a protective layer 506. As seen in FIG. 5A, compliant layer 504 and protective layer 506 are segmented into individual pads. The pads can be created by die cutting, molding, or any suitable method. Because of the way the material forming compliant layer 504 loads under stress, the individual pads enable a more even loading for each device in a lead-frame during clamping and bonding. As a result, each pad loads the same as the adjacent pad, supplying consistent pressure to each device. One large pad can be used for all devices but the devices at the top and bottom of the pad may load differently than those in the middle of the pad. This can lead to inconsistencies in the bonding process. However, in some applications, it may be desirable to have a continuous compliant layer, for example, when the semiconductor device is very small and die cutting or molding individual pads becomes complicated.

Each pad also includes a feature 508, which may be a protrusion or other 3-dimensional geometry, on protective layer 506. Feature 508 may be machined into or on protective layer 506 to provide support for structures on the semiconductor device, such as leads on a lead-frame. Features 508 may have different orientations, shapes, and sizes, as desired or required by a particular application. For example, feature 508 may be a ridge extending lengthwise along the segmented portions or pads, as opposed to width-wise as shown in the figures. Depending upon the complexity of the geometry required, manufacturing of protective layer 506 and/or feature 508 can be achieved either manually, by traditional CNC machining techniques, or for more complicated geometries, by sinker or wire EDM. Depending upon the material used, feature 508 may also be molded directly onto protective layer. Protective layer 506 may be attached to compliant layer 504 by a cyanoacrylate adhesive in one embodiment. Adhesion to base 502 may also achieved by cyanoacrylate, although other adhesives can be used. Compliant layer 504 may be molded directly onto base 502 in one embodiment.

FIG. 5B shows an end view of support 500 with base 502, compliant layer 504, protective layer 506, and feature 508. FIG. 5C shows an enlarged view of the area designated by circle 510 in FIG. 5B. FIG. 5D is a side view of support 500, showing base 502, compliant layer 504, protective layer 506, and feature 508.

FIGS. 6A and 6B show one embodiment of window clamp 600. Manufacturing of window clamp 600 may be achieved by CNC and/or wire EDM, depending on the complexity of the semiconductor devices and the requirement for clearance of the bond tool during bonding. In one embodiment, window clamp 600 is made from stainless steel because of its high modulus, yield strength, and wear characteristics, although other materials may also be suitable. Window clamp 600 can also be coated to improve its wear characteristics, such as with DLC or TiN coating. Note that in embodiments where the window clamp has a compliant layer, such as in FIGS. 3 and 4, the description of the compliant layer and the protective layer for the support can be applied to the window clamp.

Figure 7:
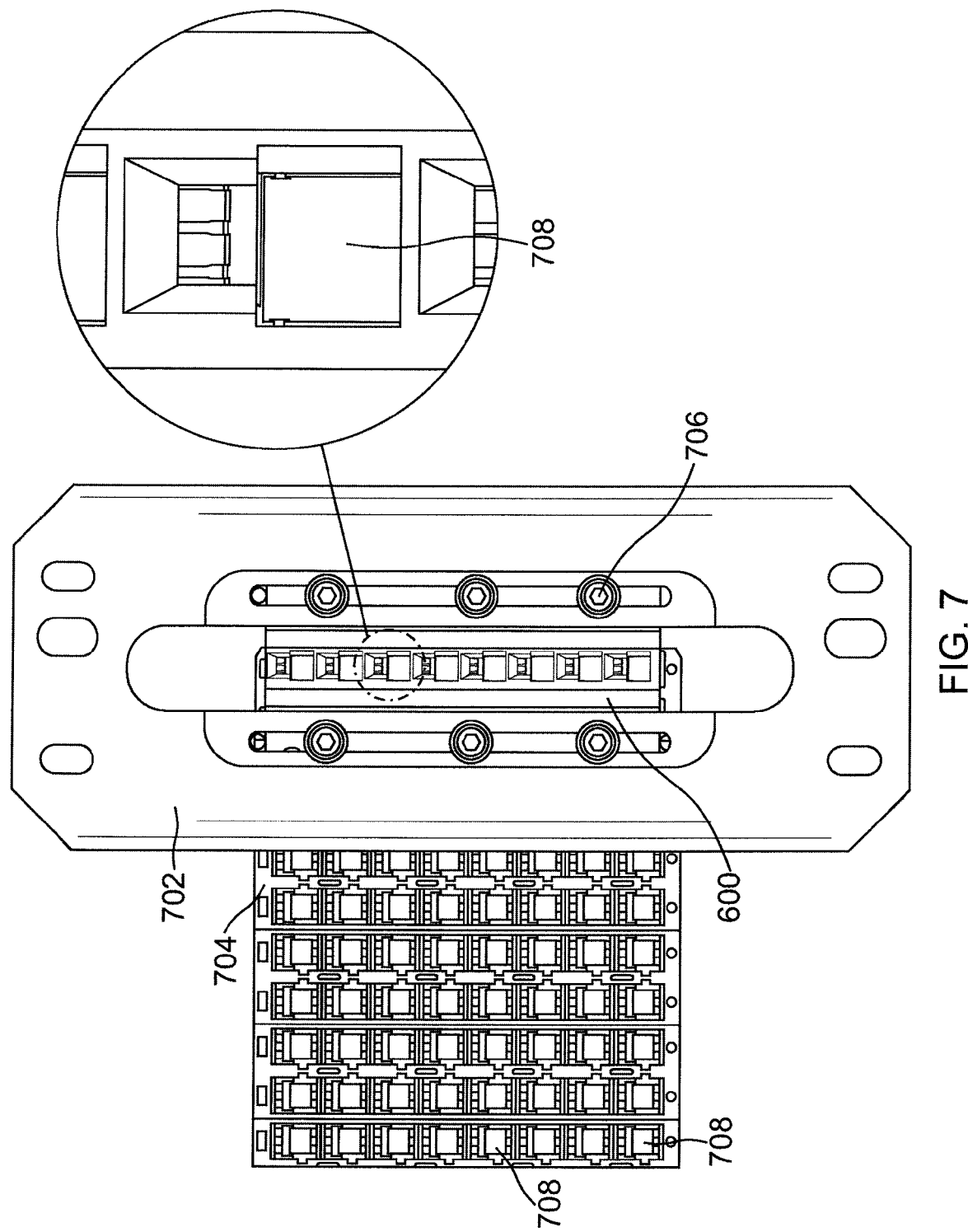
FIGS. 7, 8, and 9A-9B show one embodiment of a clamping operation using a window clamp secured to a bridge for clamping a lead-frame against support.

FIGS. 7, 8, and 9A-9B show one embodiment of a clamping operation using window clamp 600 secured to a bridge 702 for clamping a lead-frame 704 against support 204. In FIG. 7, lead-frame 704 is indexed under window clamp 600 and precisely positioned using a material transport system of a bonding machine, such as an ultrasonic wire or ribbon bonder. Bridge 702 or other supporting device holds window clamp 600, such as with screws 706. Window clamp 600 has openings or windows that allow access to semiconductor devices 708, such as chips or die, on lead-frame 704. The assembly comprising window clamp 600 and bridge 702 is attached to a cam system that lowers the assembly until window clamp 600 reaches the surface of lead-frame 704. As seen from the enlarged portion in FIG. 7, semiconductor device 708 is visible and accessible through a window on window clamp 600.

Figure 8:
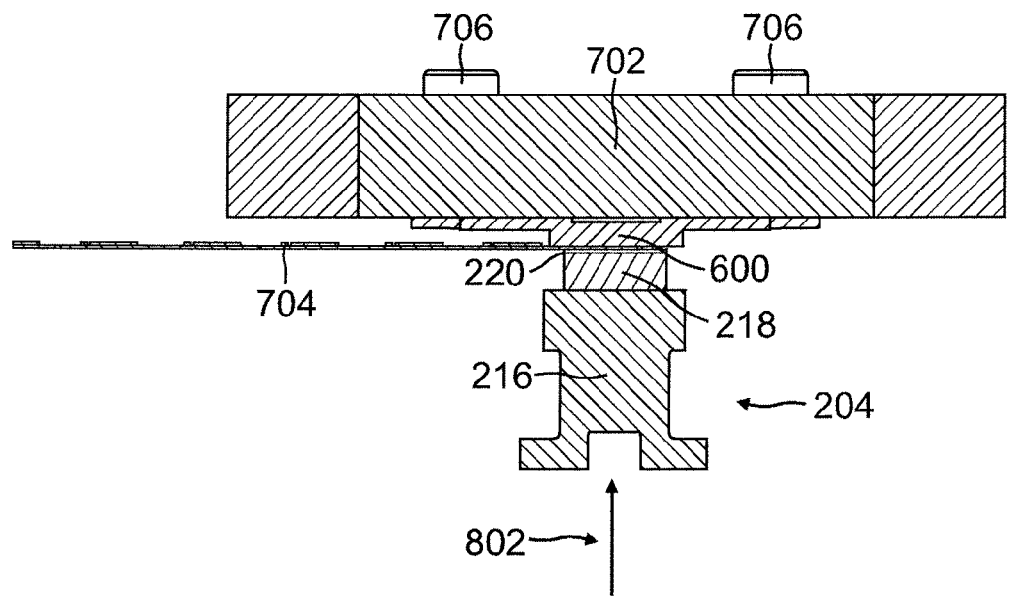

Next, as shown in FIG. 8, support 204 comprising base 216, compliant layer 218, and protective layer 220 is moved (indicated by arrow 802) to a lower surface of lead-frame 704 by a cam system or the like similar to one used to move the window clamp assembly to the upper surface of lead-frame 704. Pressure is then applied on lead-frame 704 by further travel of support 204, resulting in the compression of compliant layer 218 and protective layer 220 against lead-frame 704 and window clamp 600. Pressure is maintained while the ultrasonic bonding process is performed before the clamping process reverses and lead-frame 704 is indexed to the next position. The pressure applied to lead-frame 704 is set by the amount base 216 travels past the point of initial contact with lead-frame 704. The clamping pressure is increased until a stable process is achieved (e.g., around 3.5 MPa in one example). Determining the exact amount of pressure required to clamp a given device is usually determined by experience, or by trial and error, in the given application.

Figures 9A, 9B:
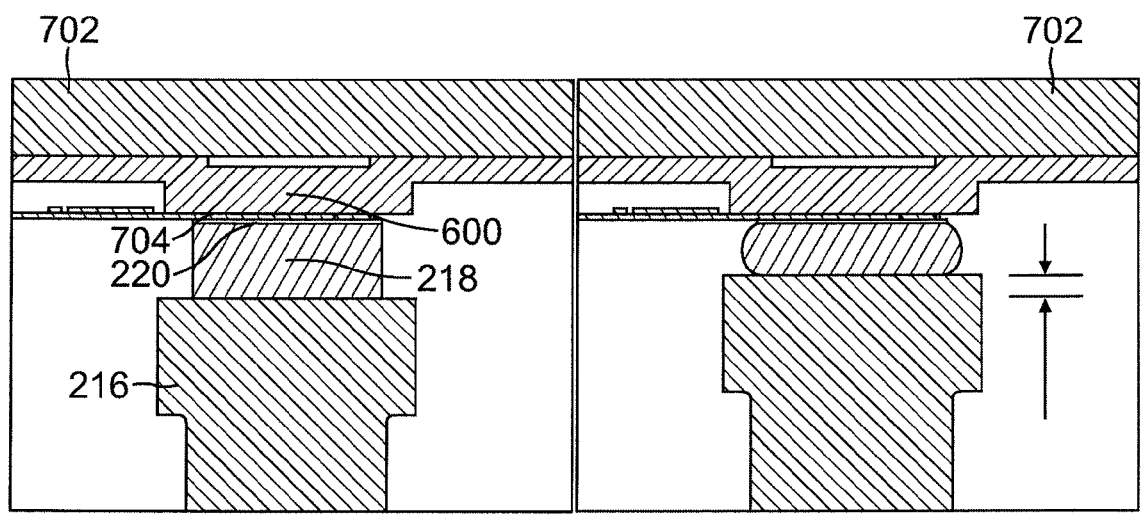

FIGS. 9A and 9B show a clamping operation before and after compression of compliant layer 218, according to one embodiment. As seen from FIG. 9B, base 216 travels an additional distance (compression distance), causing compliant layer 218 to compress, which provides improved contact with elements on lead-frame 704.

Figure 10:
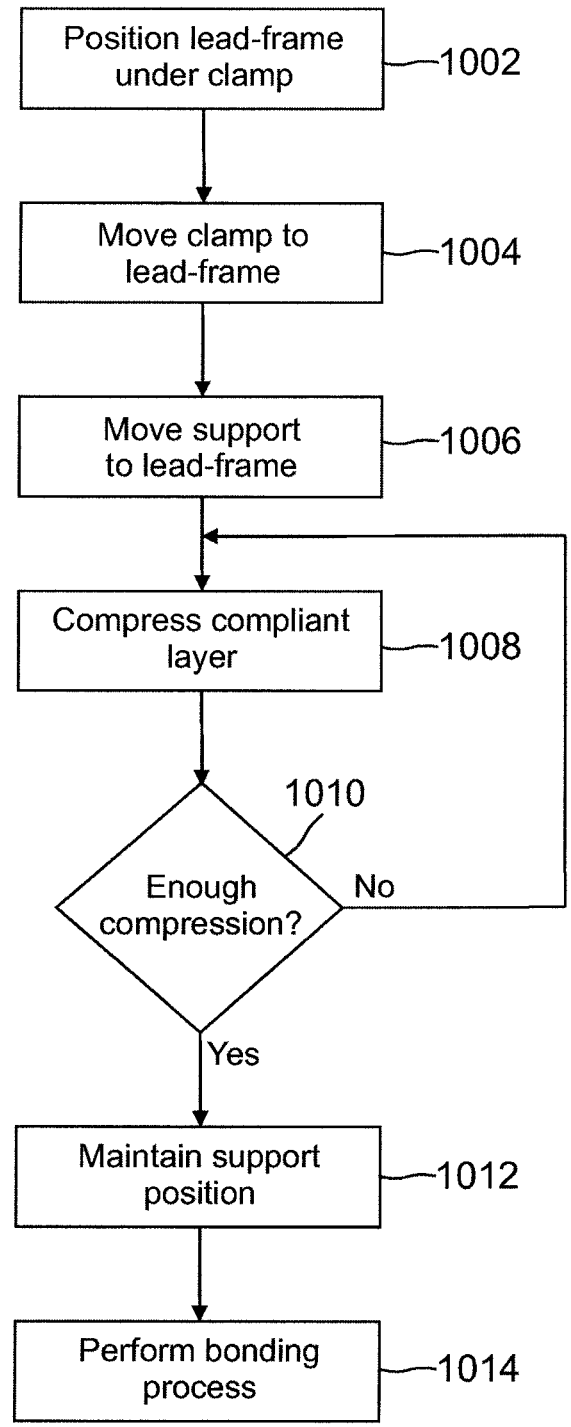
FIG. 10 is a flow chart showing a process for clamping a semiconductor device for a bonding process according to one embodiment.

FIG. 10 is a flow chart showing a process for clamping a semiconductor device according to one embodiment. At step 1002, a lead-frame containing semiconductor devices is indexed or positioned under a window clamp. Note that other packages and/or power semiconductor devices may also be suitable. Properly positioned, the individual semiconductor devices are aligned with windows in the window clamp. Once positioned, the window clamp is moved toward the lead-frame, at step 1004, until the clamp reaches the surface of the lead-frame. Next, at step 1006, the support having at least a compliant layer (and in some embodiments, a protective layer) is moved toward the lead-frame until contact is made with the lead-frame. The support continues to move such that the compliant layer is compressed between the lead-frame and the base of the support at step 1008.

A determination is then made, at step 1010, whether there is sufficient compression to secure the semiconductor device during the upcoming bonding process. As discussed above, this determination may initially be made by trial and error and then set for a specific application and material (e.g., thickness and characteristics of the compliant layer and/or protective layer). If the desired compression has not been reached, the support is further moved to compress to compliant layer. For example, if a stable process is not achieved when 30% compression is reached and polyurethane is the material used, a stiffer polyurethane may be used. In this example, exceeding 30% compression in practice may lead to premature failure of polyurethane materials when many loading and unloading cycles are achieved. Once the desired compression is obtained, movement of the support is stopped and the position of the support is maintained at step 1012, while also maintaining the position of the window clamp. At this point, the semiconductor device is secured for a bonding process to be performed, such as ultrasonic bonding, at step 1014. Note that it may be desirable with certain equipment and/or processes to move the lead-frame relative to the window clamp and/or the support. Furthermore, with embodiments in which the window clamp includes a compliant layer, the window clamp may be moved after the support has been brought into contact with the semiconductor device.

The use of a compliant layer (on the support, on the clamp, or both) to distribute even loading over the surface of the semiconductor device being clamped provides numerous benefits. Without the use of this material to distribute loading, using a stiff upper window clamp results in random points of contact between both the clamp and semiconductor device and the support and semiconductor device, assuming parallel alignment between clamp and support is nearly perfect. With misalignment in parallelism, which can be expected in most situations, one area of the support will contact the clamp first and stress tends to be concentrated in that area. This may affect the system response when loaded by ultrasonic energy, causing a poor and unrepeatable wire bonding process. Using the compliant layer circumvents the need for flexible clamp fingers by using a compliant material to achieve even clamp force in the presence of tolerance stack up between components and misalignment of the system. This may affect the system response when loaded by ultrasonic energy, causing a poor and unrepeatable wire bonding process. Using the compliant layer circumvents the need for flexible clamp fingers by using a compliant material to achieve even clamp force in the presence of tolerance stack up between components. This reduces/eliminates both unpredictable resonance issues and clamp scoot, allowing for more of the lead-frame to be clamped without worry of damage or resonances. The design of the clamps is also simplified greatly, requiring only a single piece window clamp.

Thus, benefits of using the clamp as described herein include 1) the ability to use window clamps, which are easier to design and manufacture than finger clamps, 2) reducing/eliminating clamp finger resonance issues, 3) a greater area of the lead-frame to be clamped, 4) previously untouchable areas can now be clamped, 5) simplified tooling setup for the customer, 6) more consistent clamping among devices due to less opportunities for errors in setup, 7) reducing/eliminating clamp finger scooting issues, 8) the ability to simultaneously clamp multiple columns of devices, 8) the ability to properly clamp geometrically complicated packages (e.g., some packages are hard to fit clamp fingers in all the necessary locations), and 9) efficiently and reliably bonding large wire or ribbon to very densely populated lead-frames containing very small power semiconductor devices.

In addition to the advantages of using a compliant layer with a window clamp for bonding, experiments have shown that a bonding process using the clamping as discussed herein yields results that are consistent with conventional finger clamping, thus showing the feasibility of using a compliant support with a window clamp. The three measurables investigated were loop height, deformation, and shear strength. Loop height is defined as the height of the ribbon loop between adjacent bonds as measured from the surface of the substrate containing the bonds. It is important from a process perspective to achieve consistent loop heights for both electrical properties and packaging reasons. If a loop is too high it may not be within the final epoxy encapsulation of the device. If a loop is too low it may cause undesirable electrical effects in the semiconductor package. The results of the tests showed that each of the loop-heights measured for the compliant clamping assembly are comparable to that achieved by the standard tooling.

Deformation for ribbon bonding is defined as the distance into the aluminum material the tool traverses during the formation of the bond. Consistency in deformation reflects on a consistent and well-controlled process. Comparison of results between clamping systems showed that both the mean and standard deviation of deformation achieved with the compliant clamping assembly are comparable to that achieved with the well behaved standard clamping. Shear strength is defined as the ultimate force measured while shearing through the ribbon bond. A shear test machine drags a shear tool through the bond interface while measuring the resultant force creating a map of force and displacement. The machine determines when the bond has failed and records the force at failure. For each of the bonds, both the mean value and standard deviations are comparable to the well-behaved standard clamping arrangement. Thus, based on loop height, deformation, and shear strength, reliable and consistent bonding, as compared with conventional finger clamping, may be achieved utilizing the embodiments described herein.

The foregoing disclosure is not intended to limit the present disclosure to the precise forms or particular fields of use disclosed. As such, it is contemplated that various alternate embodiments and/or modifications to the present disclosure, whether explicitly described or implied herein, are possible in light of the disclosure. Having thus described embodiments of the present disclosure, persons of ordinary skill in the art will recognize that changes may be made in form and detail without departing from the scope of the present disclosure. Thus, the present disclosure is limited only by the claims.

What is claimed is:

1. A device for supporting a semiconductor device on a wire bonding machine, the device comprising:
    a base; and
    a compliant layer over the base;
    a protective layer provided over the compliant layer, the protective layer being metallic and having a thickness between 3-15 mils, the compliant layer and the protective layer being separated into a plurality of portions over the base; and
    a feature on the protective layer to support an element of the semiconductor device, the feature being a protrusion extending above a surface of the protective layer,
    wherein the device secures the semiconductor device against a window clamp during a bonding process on the wire bonding machine.

2. The device of claim 1, wherein the protective layer is configured to bend with the compliant layer.

3. The device of claim 1, wherein the feature is provided on each of the plurality of portions of the protective layer.

4. The device of claim 1, wherein the protective layer comprises stainless steel.

5. The device of claim 1, wherein the compliant layer comprises at least one of rubber, a polymer composite, plastic, and polyurethane.

6. The device of claim 1, wherein the bonding process comprises an ultrasonic bonding process.

7. The device of claim 1, wherein the semiconductor device comprises a lead frame.

8. The device of claim 1, wherein the compliant layer comprises an elastic polymer.

9. The device of claim 1, wherein the compliant layer comprises rubber.

10. The device of claim 1, wherein the compliant layer has a minimum thickness of approximately 1 mm.

11. A clamping system for securing a semiconductor device during a wire bonding operation on a wire bonding machine, the clamping system comprising:
    a first base;
    a first compliant layer over the first base;

a first protective layer provided over the first compliant layer, the first protective layer being metallic and having a thickness between 3-15 mils, the first compliant layer and the first protective layer being separated into a plurality of portions over the first base;

a feature on the first protective layer to support an element of the semiconductor device, the feature being a protrusion extending above a surface of the first protective layer; and a window clamp that secures the semiconductor device during a wire bonding process on the wire bonding machine.

12. The system of claim 11, wherein the window clamp comprises (a) a second base; (b) a second compliant layer over the second base; and (c) a second protective layer over the second compliant layer, the second protective layer being metallic and having a thickness between 3-15 mils.

13. The system of claim 11, wherein the first compliant layer has a minimum thickness of approximately 1 mm.

14. The system of claim 11, wherein the first protective layer is configured to bend with the first compliant layer.

15. The system of claim 11, wherein the first protective layer comprises stainless steel.

16. The system of claim 15, wherein the feature is provided on each of the plurality of portions of the first protective layer.

17. The system of claim 11, wherein the semiconductor device comprises a lead frame.

18. The system of claim 11, wherein the first compliant layer comprises an elastic polymer.

19. The system of claim 11, wherein the window clamp comprises:
a second base; and
a second compliant layer over the second base.

20. The system of claim 19, wherein the window clamp further comprises a second protective layer over the second compliant layer.

21. The system of claim 20, wherein the second compliant layer and the second protective layer are separated into a plurality of portions.

22. The system of claim 19, wherein the second compliant layer has a minimum thickness of approximately 0.5 mm.

23. The system of claim 11, wherein the first compliant layer comprises a material having a durometer in a range of 2000 to 75D on a Shore durometer hardness scale.

24. The system of claim 11, wherein the first compliant layer is a polyurethane material.

25. The system of claim 11, wherein the first compliant layer comprises a material having a hardness in an A scale of a shore hardness test in a range of 50 A to 70 A.

26. The system of claim 11, wherein the first compliant layer comprises a material having a hardness in an A scale of a Shore hardness test in a range of 20 A to 95 A.

27. The system of claim 11, wherein the first compliant layer comprises at least one of rubber, a polymer composite, plastic, and polyurethane.

28. The system of claim 11, wherein the semiconductor device includes a lead-frame, and wherein the feature on the first protective layer is configured to support a lead of the lead-frame of the semiconductor device.

29. A device for supporting a semiconductor device on a wire bonding machine, the device comprising:
a window clamp;
a compliant layer secured to the window clamp;
a protective layer on the compliant layer, the protective layer being metallic and having a thickness between 3-15 mils, the compliant layer and the protective layer being separated into a plurality of portions over the window clamp; and
a feature on the protective layer to contact an element of the semiconductor device, the feature being a protrusion extending from a surface of the protective layer,
wherein the device secures the semiconductor device to a support during a bonding process on the wire bonding machine.

30. The device of claim 29, wherein the protective layer is configured to bend with the compliant layer.

31. The device of claim 29, wherein the compliant layer comprises at least one of rubber, a polymer composite, plastic, and polyurethane.

32. The device of claim 29, wherein the semiconductor device comprises a lead frame.

33. The device of claim 29, wherein the compliant layer comprises an elastic polymer.

34. The device of claim 29, wherein the protective layer comprises stainless steel.

35. The device of claim 29, wherein the compliant layer has a minimum thickness of approximately 0.5 mm.

36. A method for securing a semiconductor device during a bonding process on a wire bonding machine, comprising:
moving a window clamp to a semiconductor device;
moving a supporting device to the semiconductor device, the supporting device including (a) a base, (b) compliant layer over the base, and (c) a protective layer provided over the compliant layer, the protective layer being metallic and having a thickness between 3-15 mils, the compliant layer and the protective layer being separated into a plurality of portions over the first base, a feature being provided on the protective layer to contact an element of the semiconductor device, the feature being a protrusion extending from a surface of the protective layer; and
compressing the compliant layer of the supporting device during engagement between the window clamp, the supporting device, and the semiconductor device on the wire bonding machine.

37. The method of claim 36, wherein the protective layer is configured to bend with the compliant layer during the compressing step.

38. The method of claim 36, wherein moving the window clamp is performed before moving the supporting device and compressing the compliant layer.

39. The method of claim 36, wherein the semiconductor device comprises a lead-frame.

40. The method of claim 36, wherein the compressing comprises compressing individual ones of the portions of the compliant material corresponding with individual windows in the window clamp against the semiconductor device.

41. The method of claim 36, wherein the protective layer is configured to bend with the compliant layer.

42. The method of claim 36, wherein the semiconductor device comprises a lead-frame.

43. The method of claim 36, wherein the compliant material has a minimum thickness of approximately 1.0 mm.

* * * * *